US012598780B2

(12) United States Patent     (10) Patent No.:   US 12,598,780 B2

Loubet et al.     (45) Date of Patent:     Apr. 7, 2026

(54) GATE-ALL-AROUND TRANSISTORS WITH HYBRID ORIENTATION

(71) Applicant: International Business Machines Corporation, Armonk, NY (US)

(72) Inventors: Nicolas Jean Loubet, Guilderland, NY (US); Shogo Mochizuki, Mechanicville, NY (US); Maruf Amin Bhuiyan, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 653 days.

(21) Appl. No.: 17/807,945

(22) Filed: Jun. 21, 2022

(65) Prior Publication Data

US 2023/0411531 A1     Dec. 21, 2023

(51) Int. Cl.
    H10D 30/67     (2025.01)
    H10D 30/62     (2025.01)
    (Continued)

(52) U.S. Cl.
    CPC ..... H10D 30/6757 (2025.01); H10D 30/6735 (2025.01); H10D 62/121 (2025.01); H10D 64/017 (2025.01); H10D 30/6219 (2025.01)

(58) Field of Classification Search
    CPC ............. H10D 84/0167; H10D 84/038; H10D 62/405; H10D 30/6735; H10D 30/501; H10D 84/40–409; H10D 84/0109; H10D 30/6211; H10D 84/0158; H10D 84/0193; H10D 86/011; H10D 84/834; H10D 84/853; H10D 86/215; H10D 84/82; H10D 86/201; H10D 30/019; H10D 80/251; H10D 87/00; H10D 6/116; H10D 62/371; H10D 30/0194; H10D 30/0278; H10D 30/791; H10D 30/014; H10D 30/43; H10D 30/00;
    (Continued)

(56)     References Cited

U.S. PATENT DOCUMENTS 5,250,836 A   *   10/1993   Miura .................... H01L 21/763
                                         257/E21.228
5,308,776 A   *   5/1994   Gotou ..................... H01L 21/74
                                         257/E21.32
    (Continued)

FOREIGN PATENT DOCUMENTS

CN        113206090 A     8/2021
WO     2021203899 A1     10/2021

OTHER PUBLICATIONS

Bidal et al., "First CMOS integration of ultra thin body and Box (UTB 2) structures on bulk direct silicon bonded (DSB) wafer with multi-surface orientations," In 2009 IEEE International Electron Devices Meeting (IEDM), pp. 1-4. IEEE, 2009.
    (Continued)

*Primary Examiner* — Julio J Maldonado
*Assistant Examiner* — Paul A Berry
(74) *Attorney, Agent, or Firm* — L. Jeffrey Kelly

(57)     ABSTRACT

A semiconductor device includes a p-type field-effect transistor including first channels made of silicon having a (110) crystallographic orientation. The semiconductor device further includes an n-type field-effect transistor including second channels made of silicon having a (100) crystallographic orientation. The semiconductor device further includes a gate surrounding the first channels and the second channels.

12 Claims, 22 Drawing Sheets

(51) Int. Cl.
  H10D 62/10 (2025.01)
  H10D 64/01 (2025.01)

(58) Field of Classification Search
  CPC ......... H01L 21/02516; H01L 21/02609; H01L 21/7624; H01L 21/76267; H10B 12/36; H10B 12/056; H10P 10/12; H10P 10/126; H10P 10/14; H10W 80/327; H10W 80/301
  See application file for complete search history.

(56) References Cited

U.S. PATENT DOCUMENTS

| | | | | |
|---|---|---|---|---|
| 6,242,320 | B1 * | 6/2001 | So | H01L 21/76251 |
| | | | | 438/424 |
| 6,277,684 | B1 * | 8/2001 | Hayashi | H01L 21/76264 |
| | | | | 257/E21.258 |
| 8,034,694 | B2 * | 10/2011 | Ohnuma | H01L 21/76254 |
| | | | | 257/E21.12 |
| 8,877,606 | B2 * | 11/2014 | Dennard | H10D 86/01 |
| | | | | 438/296 |
| 9,287,357 | B2 | 3/2016 | Rodder et al. | |
| 9,472,555 | B1 | 10/2016 | Balakrishnan et al. | |
| 9,490,323 | B2 | 11/2016 | Rodder et al. | |
| 10,892,331 | B2 | 1/2021 | Yamashita et al. | |
| 11,088,258 | B2 | 8/2021 | Wang et al. | |
| 2010/0176495 | A1 * | 7/2010 | Chu | H10P 90/1916 |
| | | | | 257/E23.008 |
| 2013/0320294 | A1 * | 12/2013 | Cappellani | H10D 30/6735 |
| | | | | 257/627 |
| 2018/0114727 | A1 * | 4/2018 | Rodder | H10D 30/673 |
| 2020/0219879 | A1 * | 7/2020 | Shin | H10D 30/6757 |
| 2021/0134677 | A1 * | 5/2021 | Pan | H01L 21/76205 |
| 2021/0183852 | A1 | 6/2021 | Li et al. | |

OTHER PUBLICATIONS

Bourdelle et al., "Fabrication of Directly Bonded Si Substrates with Hybrid Crystal Orientation for Advanced Bulk CMOS Technology," ECS Transactions 3, No. 4 (2006): 409, 8 pgs.

\* cited by examiner

100

Bond first wafer to second wafer 104

Remove donor substrate from second wafer 108

Remove first portion of bonded structure 112

Form replacement structure 116

Finalize structure 120

200

212
212
212

206

204

202

226

224

200

200

200

300

300

300

400

404

412
414
412
414
412
414

410

418

406

416

422

402

400

400

GATE-ALL-AROUND TRANSISTORS WITH HYBRID ORIENTATION

BACKGROUND

The present disclosure relates to the semiconductor device fields. In particular, the present disclosure relates to semiconductor devices having gate-all-around transistors.

A field-effect transistor (FET), sometimes called a unipolar transistor, uses either electrons (in an n-channel FET, also referred to as an nFET) or holes (in a p-channel FET, also referred to as a pFET) for conduction. The four terminals of the FET are referred to as the source, gate, drain, and body, which may also be referred to as the substrate. In a FET, the drain-to-source current flows via a conducting channel that connects the source region to the drain region. The conductivity is varied by the electric field that is produced when a voltage is applied between the gate and source terminals. Accordingly, the current flowing between the drain and source is controlled by the voltage applied between the gate and source.

A gate-all-around field-effect transistor (GAAFET) is a non-planar transistor in which the gate material surrounds the channel region on all sides.

SUMMARY

Embodiments of the present disclosure include a semiconductor device. The semiconductor device includes a p-type field-effect transistor including first channels made of silicon having a (110) crystallographic orientation. The semiconductor device further includes an n-type field-effect transistor including second channels made of silicon having a (100) crystallographic orientation. The semiconductor device further includes a gate surrounding the first channels and the second channels.

Additional embodiments of the present disclosure include a method of making a semiconductor device. The method includes bonding a first wafer including a first silicon substrate having a first crystallographic orientation to a second wafer including a second silicon substrate having a second crystallographic orientation. The method further includes removing the second silicon substrate. The method further includes removing a portion of a stack of alternating silicon layers and silicon germanium layers from the second wafer, wherein each of the silicon layers has the second crystallographic orientation. The method further includes forming a further stack of alternating further silicon layers and further silicon germanium layers on the first wafer, wherein each of the further silicon layers has the first crystallographic orientation.

Additional embodiments of the present disclosure include forming a p-type field-effect transistor including channels having a first crystallographic orientation on a first wafer. The method further includes forming an n-type field-effect transistor including channels having a second crystallographic orientation on the first wafer. The first crystallographic orientation is different than the second crystallographic orientation. Forming the p-type field-effect transistor and forming the n-type field-effect transistor includes forming a gate surrounding the channels having the first crystallographic orientation and the channels having the second crystallographic orientation.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

DETAILED DESCRIPTION

Figure 1:
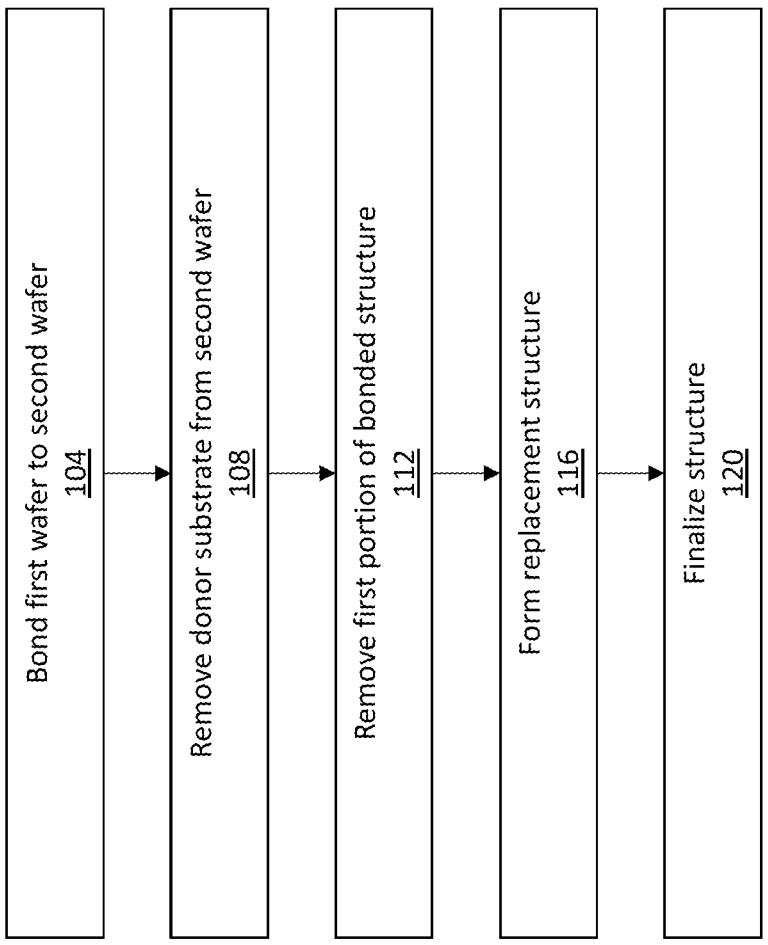
FIG. 1 illustrates a flowchart of an example method for forming a semiconductor device including a p-type field-effect transistor having silicon channels with a first crystallographic orientation and an n-type field-effect transistor having silicon channels with a second crystallographic orientation, in accordance with embodiments of the present disclosure.

Aspects of the present disclosure relate generally to the semiconductor device fields. In particular, the present disclosure relates to complementary metal-oxide semiconductor (CMOS) devices having gate-all-around transistors. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

In general, the various processes used to form a microchip that will be packaged into an integrated circuit (IC) fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, a transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

A field-effect transistor (FET), sometimes called a unipolar transistor, uses either electrons (in an n-channel FET, also referred to as an nFET or an n-type FET) or holes (in a p-channel FET, also referred to as a pFET or a p-type FET) for conduction. The four terminals of the FET are referred to as the source, gate, drain, and body, which may also be referred to as the substrate. In a FET, the drain-to-source current flows via a conducting channel that connects the source region to the drain region. The conductivity is varied by the electric field that is produced when a voltage is applied between the gate and source terminals. Accordingly, the current flowing between the drain and source is controlled by the voltage applied between the gate and source.

Complementary metal-oxide-semiconductor (CMOS) is a type of metal—oxide— semiconductor field-effect transistor (MOSFET) fabrication process that uses complementary and symmetrical pairs of p-type and n-type MOSFETs for logic functions. In logic CMOS, each pair includes a p-type MOSFET (also referred to as pFET) and an n-type MOSFET (also referred to as n-FET) arranged adjacent to one another with a shared gate. CMOS technology is used for constructing integrated circuit (IC) chips, including microprocessors, microcontrollers, memory chips, and other digital logic circuits.

Gate-all-around (GAA) field-effect transistors are a type of non-planar nanostructure transistor device architecture in which the FETs are built on a substrate such that the gate material surrounds all sides of the channel region. GAA CMOS devices have significantly faster switching times and higher current density than planar CMOS technology.

As described in further detail below, presently disclosed are embodiments of a gate-all-around architecture for CMOS integration wherein the p-type and n-type transistors of the same pair have different channel orientations. Channel orientation refers to the crystallographic orientation of the material that makes up the channel. For example, in CMOS technology, silicon layers that make up the channels typically have a (110) or (100) orientation.

Notably, silicon channels having a (100) crystallographic orientation are better suited for nFETs than for pFETs because they promote greater hole mobility, enabling faster transport in nFETs, and have lower electron mobility. Conversely, silicon channels having a (110) crystallographic orientation are better suited for pFETs than for nFETs because they promote greater electron mobility, enabling faster transport in pFETs, and have lower hole mobility.

One advantage of embodiments of the present disclosure is the ability to utilize silicon channels having different crystallographic orientations for the nFET and for the pFET in the same CMOS pair of a GAA CMOS device. This arrangement of silicon channels with different crystallographic orientations is referred to herein as a "hybrid orientation." More specifically, embodiments of the present disclosure enable a GAA CMOS device having a pFET with (110) oriented silicon channels and an nFET with (100) oriented silicon channels in the same CMOS, thereby optimizing both. For example, changing the substrate orientation of the pFET from (100) to (110) can double the hole mobility for the same channel thickness, thereby substantially improving device performance.

One strategy for forming an nFET on (100) oriented silicon channels and a pFET on (110) oriented silicon channels includes forming the nFET and the pFET next to a dielectric (for example, directly on the silicon substrate). Such methods produce unsatisfactory results due to the generation of defects on the substrate which then propagate into the channel.

Embodiments of the present disclosure may overcome these and other drawbacks of hybrid orientation by bonding together two separate silicon structures having different crystallographic orientations. As discussed in further detail below, embodiments of the present disclosure enable removal of a first portion of one of the bonded silicon structures, the first portion having the first crystallographic orientation. Additionally, embodiments of the present disclosure enable formation of a replacement portion where the first portion was removed, the replacement portion having the second crystallographic orientation. Notably, the resulting structure includes channels having two different crystallographic orientations on the same horizontal level. In other words, they are not vertically stacked. Accordingly, embodiments of the present disclosure enable a hybrid orientation in a pair of p-type and n-type transistors on the same wafer of a GAA CMOS device.

FIG. 1 depicts a flowchart of an example method 100 for forming a semiconductor device including a GAA CMOS device having a hybrid orientation, in accordance with embodiments of the present disclosure. The method 100 begins with operation 104, wherein a first wafer is bonded with a second wafer. In accordance with some embodiments of the present disclosure, the performance of operation 104 further includes the performance of a number of sub-operations.

In accordance with at least one embodiment of the present disclosure, the performance of operation 104 includes bonding a first wafer having a silicon substrate with a (110) crystallographic orientation and a second wafer having a silicon substrate with a (100) crystallographic orientation. In accordance with some embodiments of the present invention, the wafers are silicon-on-insulator (SOI) wafers having additional layers built thereon. For example, in some embodiments, the first wafer has an oxide layer formed on the silicon substrate. In some embodiments, the oxide layer is made of a bonding oxide such as, for example, a silicon nitride (SiN) or silicon dioxide (SiO2) material. In some embodiments, the second wafer has a set of alternating silicon and silicon germanium (SiGe) layers formed between the silicon substrate and a buried layer. In some embodiments, such as in the case of SOI wafers, the buried layer can be an oxide layer. In another embodiment, the buried layer can be made of, for example, a SiGe material. The buried oxide layer can serve as an etch stop layer as described in further detail below.

Figure 2A:
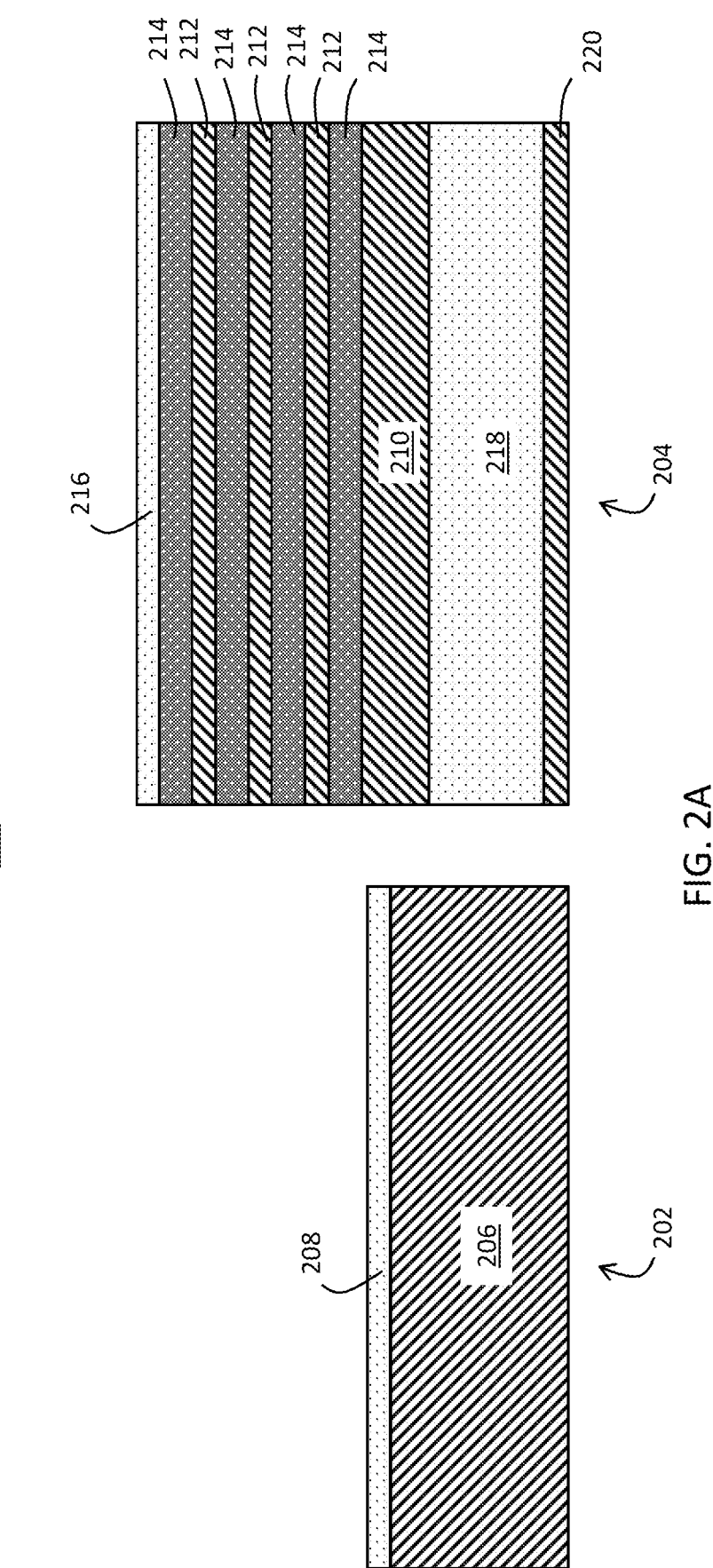
FIG. 2A illustrates a cross-sectional schematic view of an example of a structure following the performance of a portion of the example method of FIG. 1, in accordance with embodiments of the present disclosure.

FIG. 2A depicts an example structure 200 prior to the performance of the portion of operation 104 described above. The example structure 200 includes a first wafer 202 and a second wafer 204. The first wafer 202 includes a silicon substrate 206 having a (110) crystallographic orientation and a layer of oxide 208 formed on the top side of the silicon substrate 206. The second wafer 204 includes a silicon substrate 210 having a (100) crystallographic orientation. On the front side of the silicon substrate 210, the second wafer 204 includes a set of alternating silicon layers 212 and silicon germanium layers 214. Each of the silicon layers 212 and silicon germanium layers 214 has the same crystallographic orientation as the silicon substrate 210 on which it is formed. Accordingly, each of the silicon layers 212 has a (100) crystallographic orientation. On the front side of the silicon substrate 210, the second wafer 204 further includes a bonding oxide layer 216 separated from the silicon substrate 210 by the silicon layers 212 and silicon germanium layers 214.

In the embodiment shown, the second wafer 204 includes three silicon layers 212. However, in alternative embodiments, the second wafer 204 may include more or fewer than three silicon layers 212. The number of silicon germanium layers 214 is one greater than the number of silicon layers 212 due to the silicon germanium layers 214 being used to isolate each of the silicon layers 212 from each other and from surrounding layers and structures.

Figure 2B:
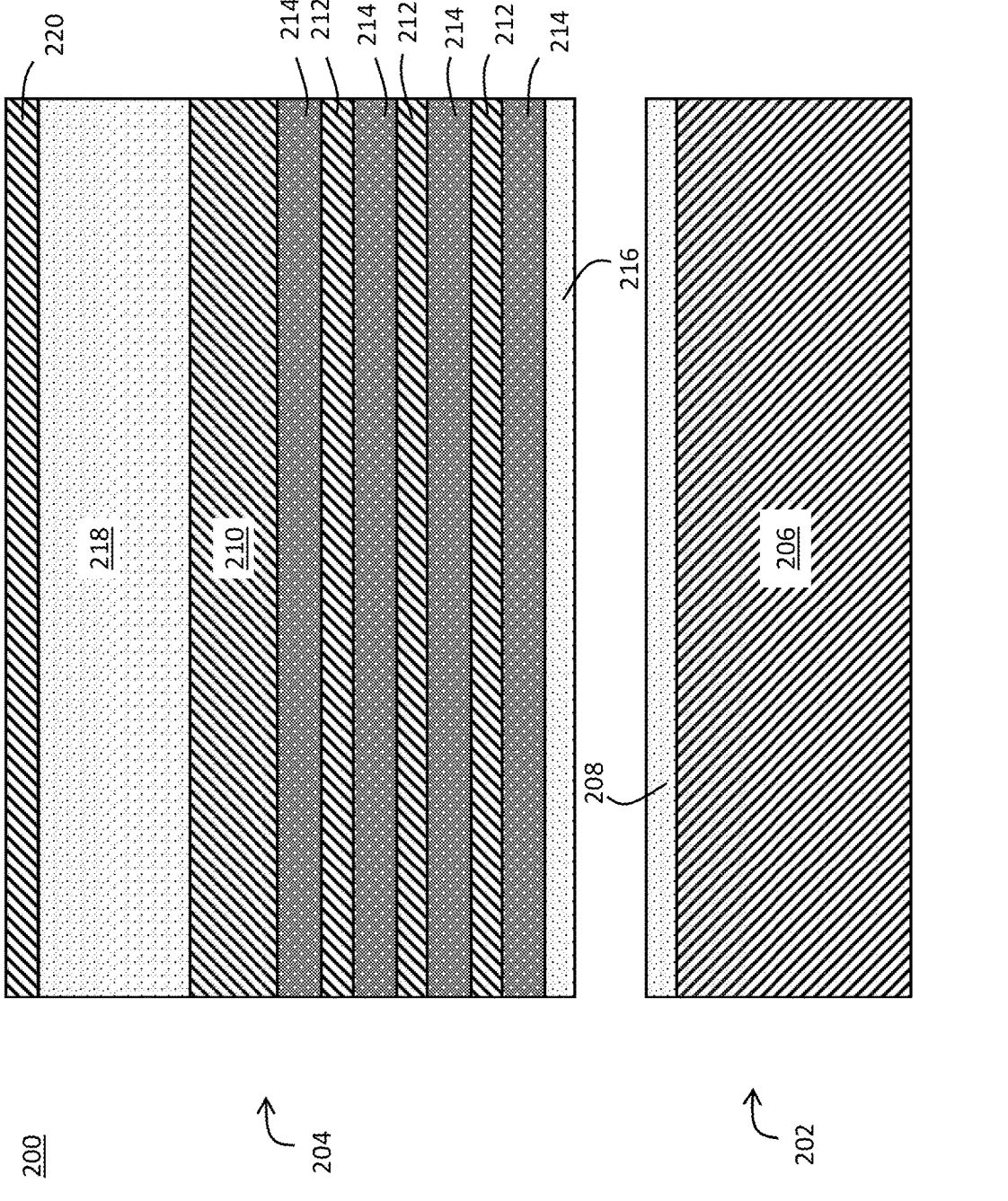
FIG. 2B illustrates a cross-sectional schematic view of an example of a structure following the performance of a portion of the example method of FIG. 1, in accordance with embodiments of the present disclosure.

FIG. 2B depicts the example structure 200 following the performance of a portion of operation 104 described above. In particular, FIG. 2B illustrates that the second wafer 204 has been flipped upside down and arranged over the first wafer 202 such that the oxide layer 216 of the second wafer 204 is arranged above the layer of oxide 208 of the first wafer 202.

Figure 2C:
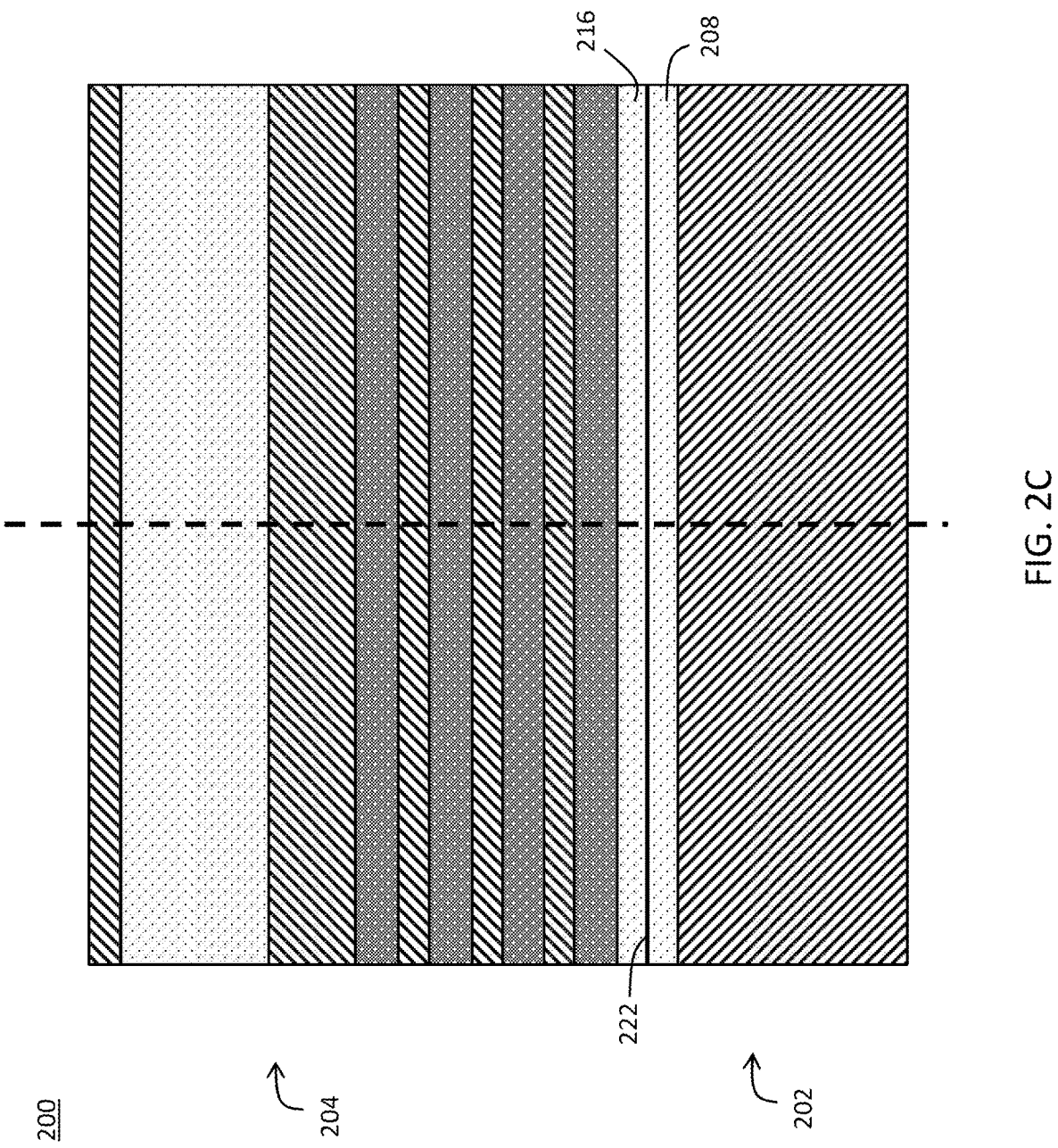
FIG. 2C illustrates a cross-sectional schematic view of an example of a structure following the performance of a portion of the example method of FIG. 1, in accordance with embodiments of the present disclosure.

FIG. 2C depicts the example structure 200 following the performance of a portion of operation 104 described above. In particular, FIG. 2C illustrates the second wafer 204 and the first wafer 202 bonded together. More specifically, the oxide layer 216 of the second wafer 204 and the layer of oxide 208 of the first wafer 202 are bonded together such that a bonding interface 222 is formed between the first wafer 202 and the second wafer 204. The oxide layer 216 and the layer of oxide 208 can be bonded together in a known manner so as to produce an integrated, single structure that is not intended to be separated.

Once the first and second wafers 202, 204 have been bonded together, they can be considered to be a single bonded structure. As described in further detail below, a first portion of the bonded structure will be used for a pFET in a final device, and a second portion of the bonded structure will be used for an nFET in the final device. The dashed vertical line shown in FIG. 2C illustratively indicates a theoretical border between the first portion and the second portion.

Returning to FIG. 1, following the performance of operation 104, the method 100 proceeds with the performance of operation 108, wherein the donor substrate is removed from the second wafer of the bonded structure. In accordance with some embodiments of the present disclosure, the performance of operation 108 includes cleaving the donor substrate from the bonded structure. Alternatively, the donor substrate can be removed in any suitable manner.

Figure 2D:
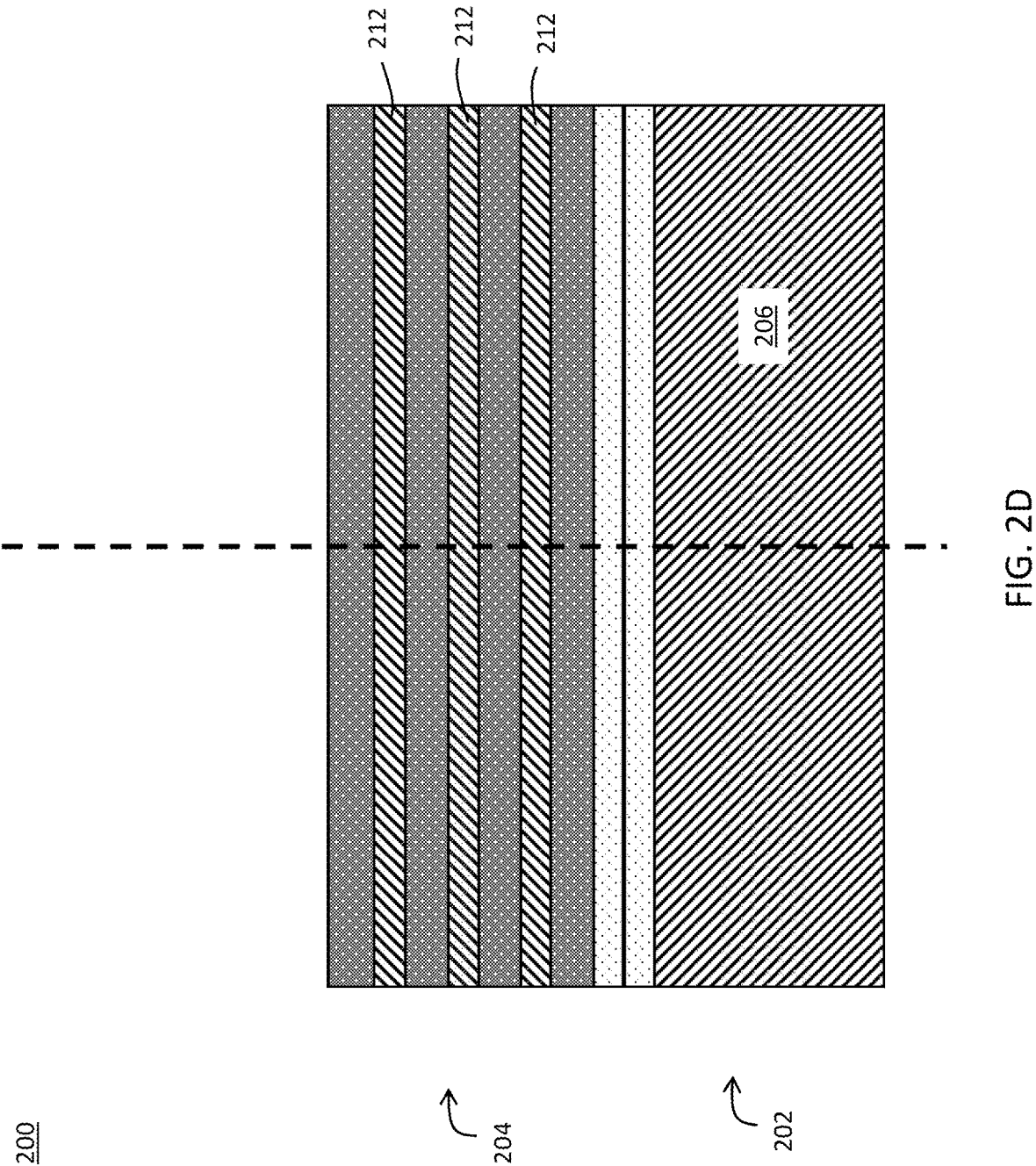
FIG. 2D illustrates a cross-sectional schematic view of an example of a structure following the performance of a portion of the example method of FIG. 1, in accordance with embodiments of the present disclosure.

FIG. 2D illustrates the structure 200 following the performance of operation 108. Notably, the removal of the silicon substrate 210 (shown in FIG. 2A) of the second wafer 204 inherently includes the removal of the buried layer 218 and further silicon layer 220 (shown in FIG. 2A) of the second wafer 204. As a result, the structure 200 now includes a silicon substrate 206 having a (110) crystallographic orientation and a set of silicon layers 212 attached thereto and having a (100) crystallographic orientation.

Returning to FIG. 1, following the performance of operation 108, the method 100 proceeds with the performance of operation 112, wherein a first portion of the bonded structure is removed. In accordance with some embodiments of the present disclosure, the performance of operation 112 includes the performance of a number of sub-operations.

In accordance with at least one embodiment of the present disclosure, the performance of operation 112 includes depositing and patterning a hard mask on the portion of the bonded structure from which the first portion is not to be removed. More specifically, if the first portion of the bonded structure which is to be removed is that which will be ultimately used for the pFET in the final device, then the portion of the bonded structure which will be ultimately used for the nFET in the final device is covered by the hard mask.

Figure 2E:
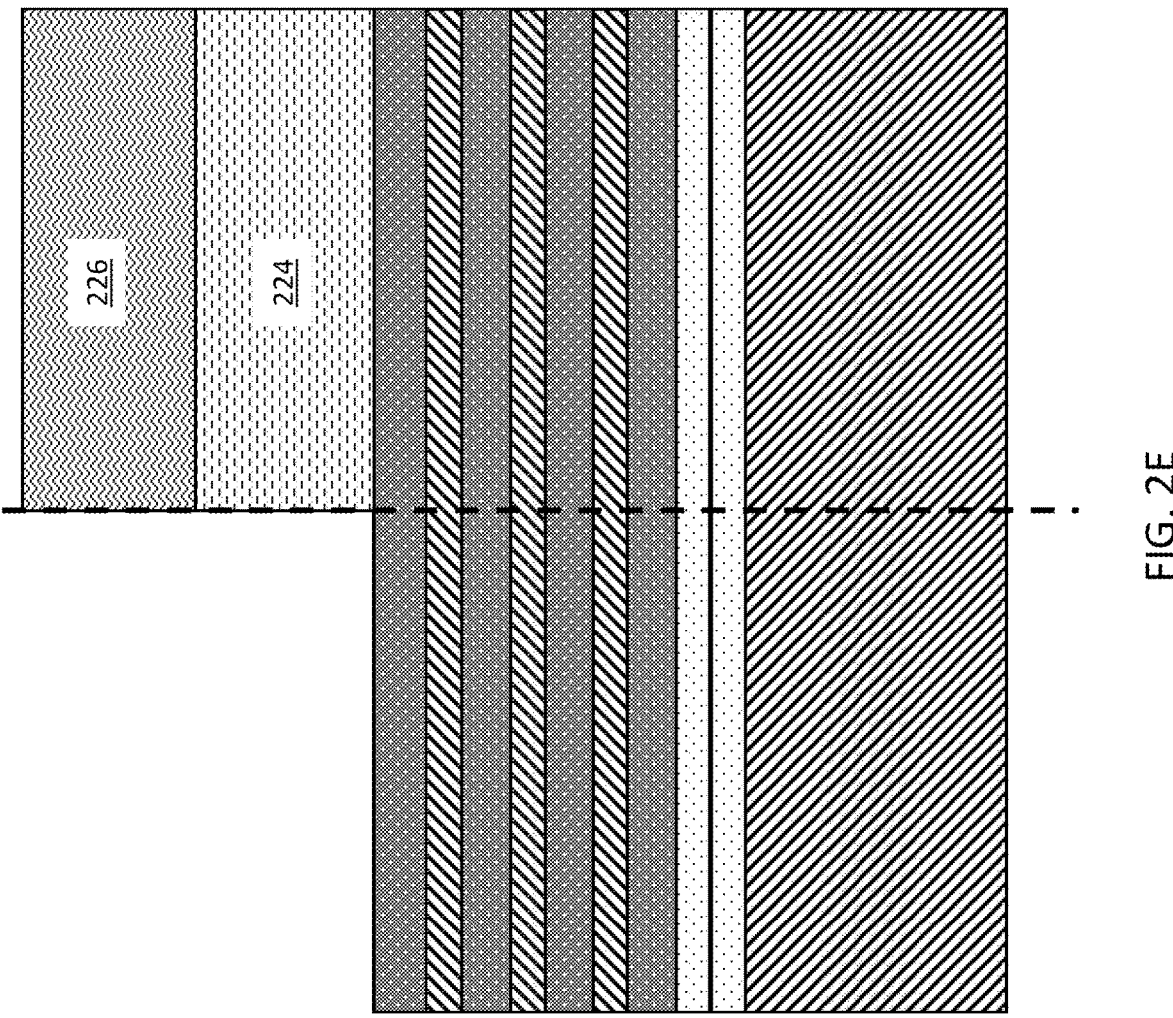
FIG. 2E illustrates a cross-sectional schematic view of an example of a structure following the performance of a portion of the example method of FIG. 1, in accordance with embodiments of the present disclosure.

FIG. 2E illustrates the structure 200 following the performance of this portion of operation 112. As shown, the deposited and patterned hard mask 224 and sacrificial cap 226 cover the portion of the structure 200 which will be ultimately used for the nFET in the final device. Conversely, the deposited and patterned hard mask 224 and sacrificial cap 226 do not cover the portion of the structure 200 which will be ultimately used for the pFET in the final device.

In accordance with at least one embodiment of the present disclosure, the performance of operation 112 further includes performing an etch that will result in a superlattice. More specifically, the etch removes the sacrificial cap from the portion of the structure that was covered by the hard mask and removes the silicon layers and silicon germanium layers from the portion of the structure that was not covered by the hard mask. In other words, the hard mask is selective to the sacrificial cap such that the sacrificial cap is etched and the hard mask acts as an etch stop for the etch procedure.

In accordance with at least one embodiment of the present disclosure, the performance of operation 112 further includes removing the bonding oxide layers from the portion of the structure that was not covered by the hard mask. In accordance with one embodiment, the bonding oxide layer can be removed by punching through the oxide layer. in alternative embodiments, the bonding oxide layer can be removed in a different manner such as by another etch procedure. Any removal procedure can be performed so long as no other layers or structures are impacted by the removal of the bonding oxide layers from the portion of the structure that was not covered by the hard mask.

Accordingly, operation 112 includes the removal of the silicon layers and silicon germanium layers from the portion of the structure that was not covered by the hard mask as well as the bonding oxide layers from the portion of the structure that was not covered by the hard mask. In other words, these areas of the silicon layers, silicon germanium layers, and bonding oxide layers make up the first portion of the bonded structure which is removed from the bonded structure in the performance of operation 112.

Figure 2F:
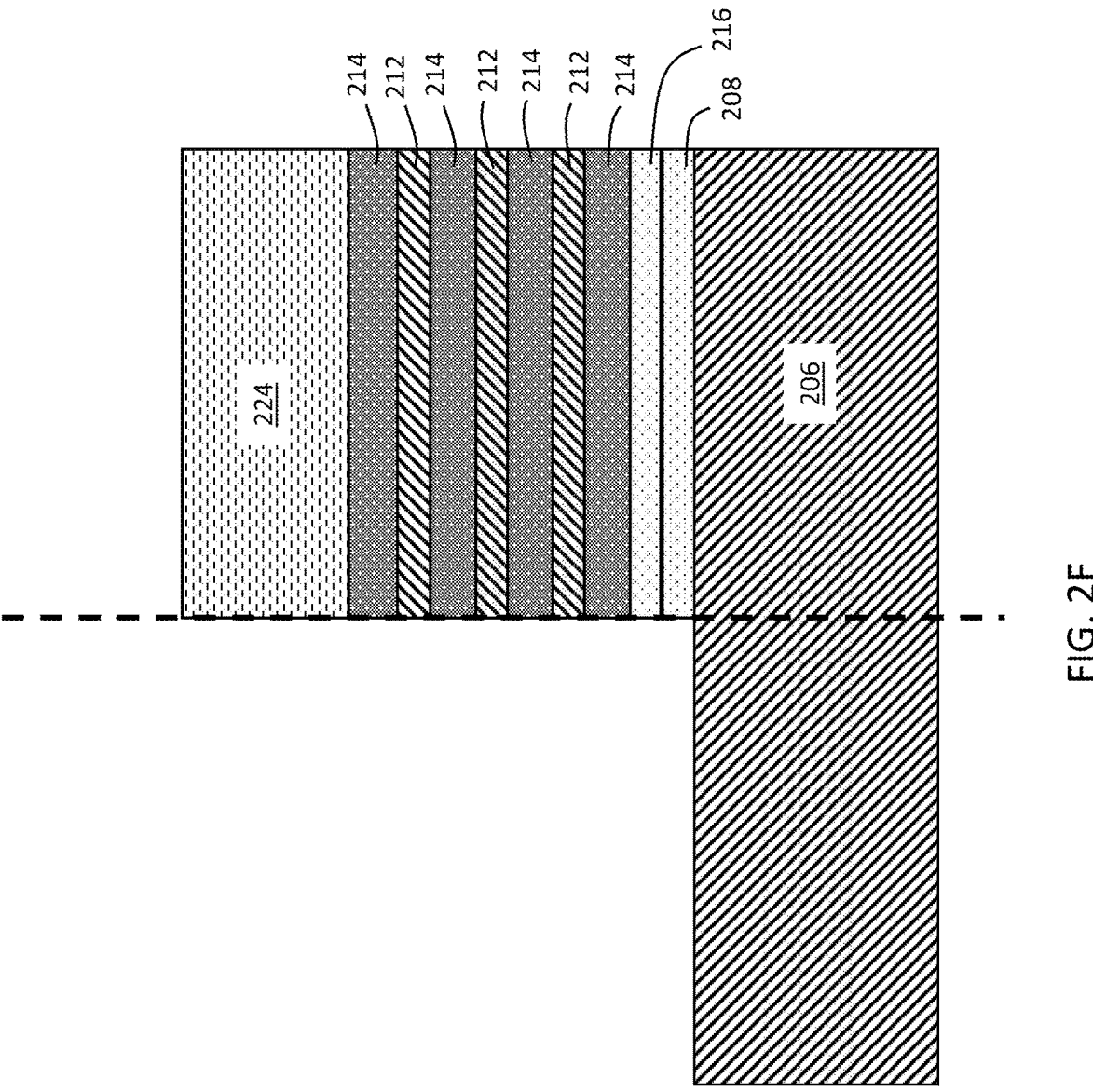
FIG. 2F illustrates a cross-sectional schematic view of an example of a structure following the performance of a portion of the example method of FIG. 1, in accordance with embodiments of the present disclosure.

FIG. 2F illustrates the structure 200 following the performance of these portions of operation 112. As shown, the sacrificial cap 226 (shown in FIG. 2E) has been removed from above the hard mask 224, and the silicon layers 212 and silicon germanium layers 214 have been removed from the portion of the structure 200 that was not covered by the hard mask 224. Additionally, the layer of oxide 208 and oxide layer 216 have been removed from the portion of the structure 200 that was not covered by the hard mask 224. Accordingly, the silicon substrate 206 having a (110) crystallographic orientation is exposed in the portion of the structure 200 that was not covered by the hard mask 224. Additionally, the remaining portions of the silicon layers 212 and silicon germanium layers 214 form a superlattice in which each of the silicon layers 212 has a (100) crystallographic orientation.

Returning to FIG. 1, following the performance of operation 112, the method 100 proceeds with the performance of operation 116, wherein a replacement structure is formed. In accordance with some embodiments of the present disclosure, the performance of operation 116 includes the performance of a number of sub-operations.

In accordance with at least one embodiment of the present disclosure, the performance of operation 116 includes forming silicon layers and silicon germanium layers on the exposed portion of the silicon substrate. In one embodiment, a SiGe material having a high percentage of germanium is epitaxially grown on the exposed portion of the substrate before the deposition of silicon and silicon germanium layers. In such embodiments, the exposed silicon substrate acts as a seed layer. Notably, epitaxial growth results in layers having the same crystallographic orientation as the seed layer. Accordingly, the silicon germanium layer with a higher percentage of germanium will have the same orientation as the silicon substrate on which it is formed. This high germanium percentage SiGe material is removed in a subsequent operation and replaced with a bottom dielectric isolation (BDI) layer, as is illustratively depicted in FIG. 2I. In accordance with at least one embodiment of the present disclosure, the high germanium percentage SiGe material has a thickness that is substantially similar to that of the bonding oxide layers. In other words, the high germanium percentage SiGe material is substantially coplanar with an uppermost surface of the bonding oxide layers.

In accordance with at least one embodiment of the present disclosure, the performance of operation 116 further includes the formation of alternating layers of silicon germanium material and silicon material on top of the high germanium percentage SiGe material. In particular, a silicon germanium layer is formed on top of the high germanium percentage SiGe material, a silicon layer is formed on top of the silicon germanium layer, and subsequent layers are alternated in the same pattern.

In accordance with at least one embodiment of the present disclosure, the alternating layers of silicon germanium material and silicon material are formed by epitaxial growth on top of the high germanium percentage SiGe material. In such embodiments, the high germanium percentage SiGe material acts as a seed layer. As noted above, epitaxial growth results in layers having the same crystallographic orientation as the seed layer. Accordingly, the layers of silicon germanium material and silicon material will have the same orientation as the high germanium percentage SiGe material and as the silicon substrate on which they are formed.

Accordingly, operation 116 includes the formation of the high germanium percentage SiGe material, silicon layers, and silicon germanium layers in the portion of the structure from which the first portion of the bonded structure was removed. In other words, the high germanium percentage SiGe material, silicon layers, and silicon germanium layers make up the replacement portion which is formed in the performance of operation 116.

Notably, the number of silicon layers in the replacement portion can be selected and can be different than that of the other portion of the structure. Having a different number of silicon layers in the replacement portion may be convenient for different applications and/or device characteristics. For embodiments in which the number of silicon layers is different in the replacement portion, the thickness of the silicon germanium layers separating the silicon layers can be altered accordingly. The thickness of the silicon germanium layers provides the separation distance between silicon layers and can also be referred to as the T-spacing of the silicon-silicon germanium stack.

Figure 2G:
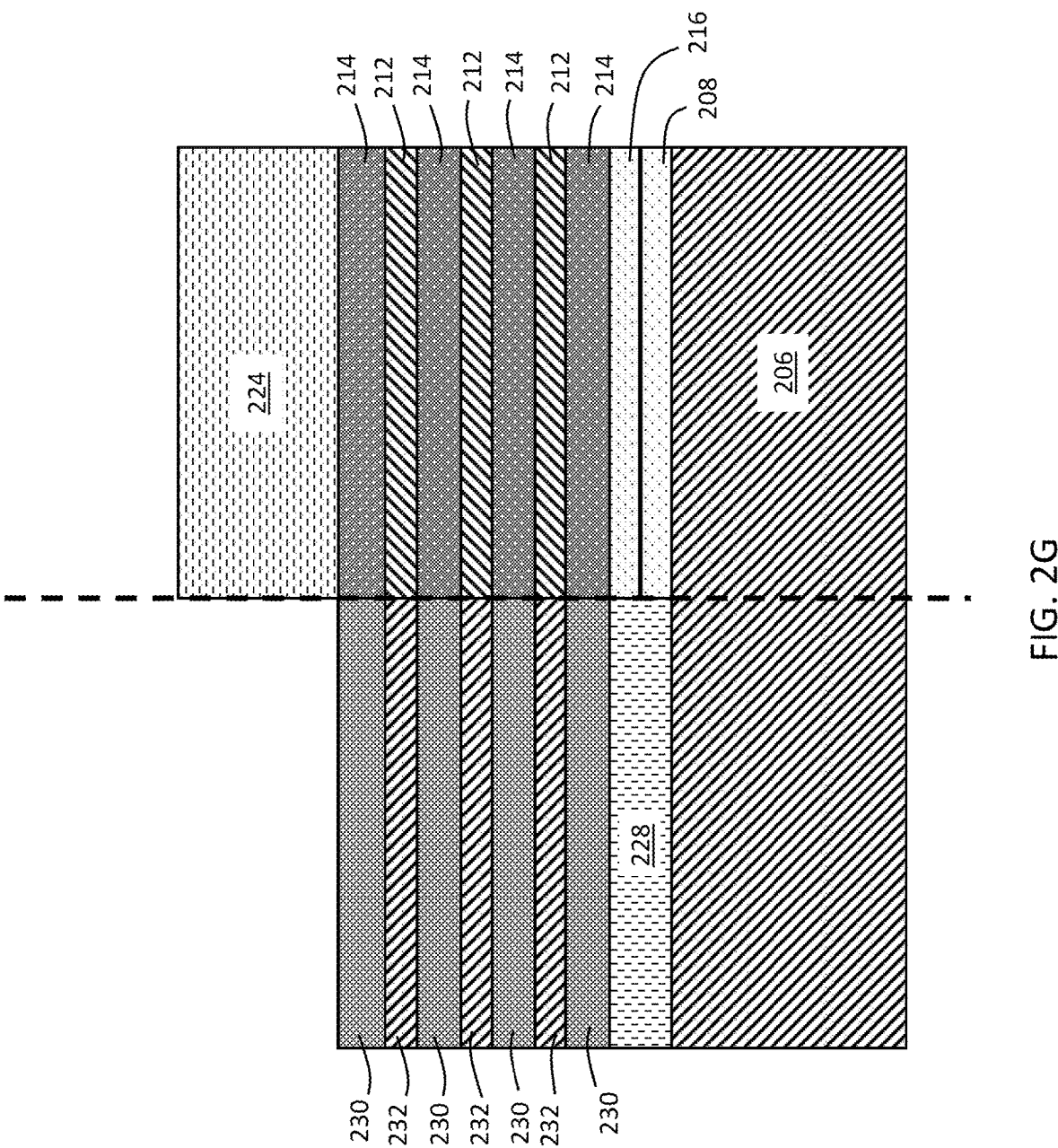
FIG. 2G illustrates a cross-sectional schematic view of an example of a structure following the performance of a portion of the example method of FIG. 1, in accordance with embodiments of the present disclosure.

FIG. 2G illustrates the structure 200 following the performance of operation 116. As shown, the structure 200 includes a high germanium percentage SiGe material 228, used for subsequent BDI formation, on top of the exposed surface of the silicon substrate 206 having a (110) crystallographic orientation. The high germanium percentage SiGe material 228 has a thickness that is substantially the same as that of the layer of oxide 208 and oxide layer 216. Accordingly, an uppermost surface of the high germanium percentage SiGe material 228 is substantially coplanar with the uppermost surface of the oxide layer 216.

The structure 200 further includes alternating silicon germanium layers 230 and silicon layers 232 formed on top of the high germanium percentage SiGe material 228. In the embodiment shown in FIG. 2G, the number of silicon layers 232 is the same as the number of silicon layers 212. However, as noted above, the number of silicon layers 232 in the replacement portion can be different than the number of silicon layers 212.

Importantly, the uppermost surface of the top-most silicon germanium layer 230 in the replacement portion of the structure 200 is substantially coplanar with the uppermost surface of the top-most silicon germanium layer 214 covered by the hard mask 224 despite the fact that the two were formed separately at different times. This coplanarity is important for the success of the performance of subsequent fabrication procedures.

Notably, the structure 200 now includes a first superlattice in the portion of the structure 200 which will be ultimately used for the pFET in the final device that has silicon layers having a (110) crystallographic orientation. The structure 200 also includes a second superlattice in the portion of the structure 200 which will be ultimately used for the nFET in the final device that has silicon layers having a (100) crystallographic orientation. Both the first and second superlattices are on a shared silicon substrate 206 having a (110) crystallographic orientation. Accordingly, the structure 200 is now considered to have a hybrid orientation substrate.

Returning to FIG. 1, following the performance of operation 116, the method 100 proceeds with operation 120, wherein the structure is finalized. In accordance with at least one embodiment of the present disclosure, the performance of operation 120 includes the performance of a number of sub-operations.

In accordance with at least one embodiment of the present disclosure, the performance of operation 120 includes removing the hard mask from the structure. In such embodiments, the performance of operation 120 may also include performing a CMP process to further improve the coplanarity of the uppermost surfaces of the top-most silicon germanium layers in the replacement portion and in the portion that was covered by the hard mask.

Figure 2H:
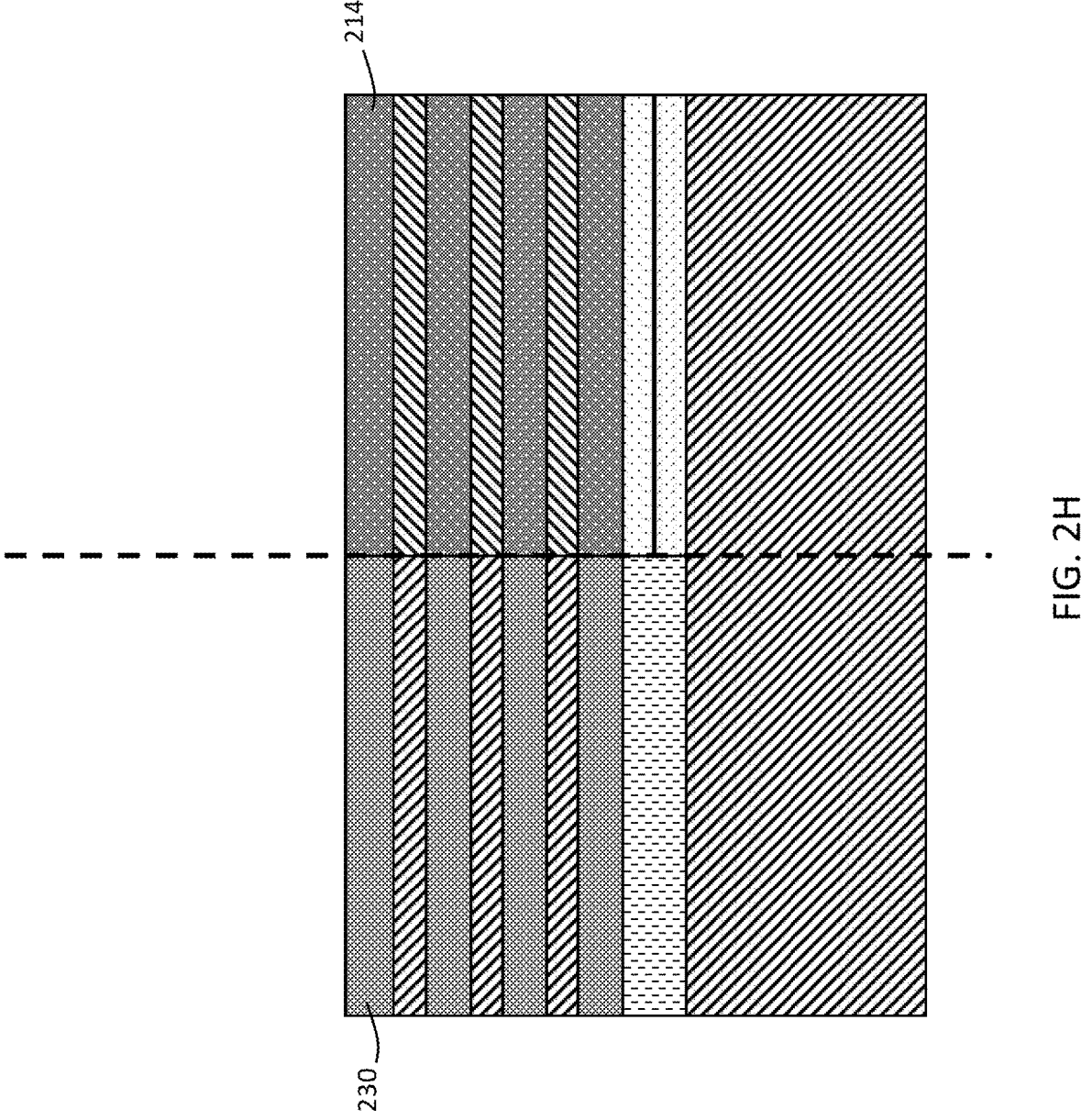
FIG. 2H illustrates a cross-sectional schematic view of an example of a structure following the performance of a portion of the example method of FIG. 1, in accordance with embodiments of the present disclosure.

FIG. 2H depicts the structure 200 following the performance of this portion of operation 120. As shown, the hard mask 224 (shown in FIG. 2G) has been removed from the structure 200. Additionally, the uppermost surface of the top-most silicon germanium layer 230 in the replacement portion and the uppermost surface of the top-most silicon germanium layer 214 that was under the hard mask are substantially coplanar with one another.

In accordance with at least one embodiment of the present disclosure, the performance of operation 120 further includes gate patterning for the pFET and nFET of the final device. Gate patterning in the performance of operation 120 is not within the scope of this disclosure and can be achieved in any suitable manner.

Figure 2I:
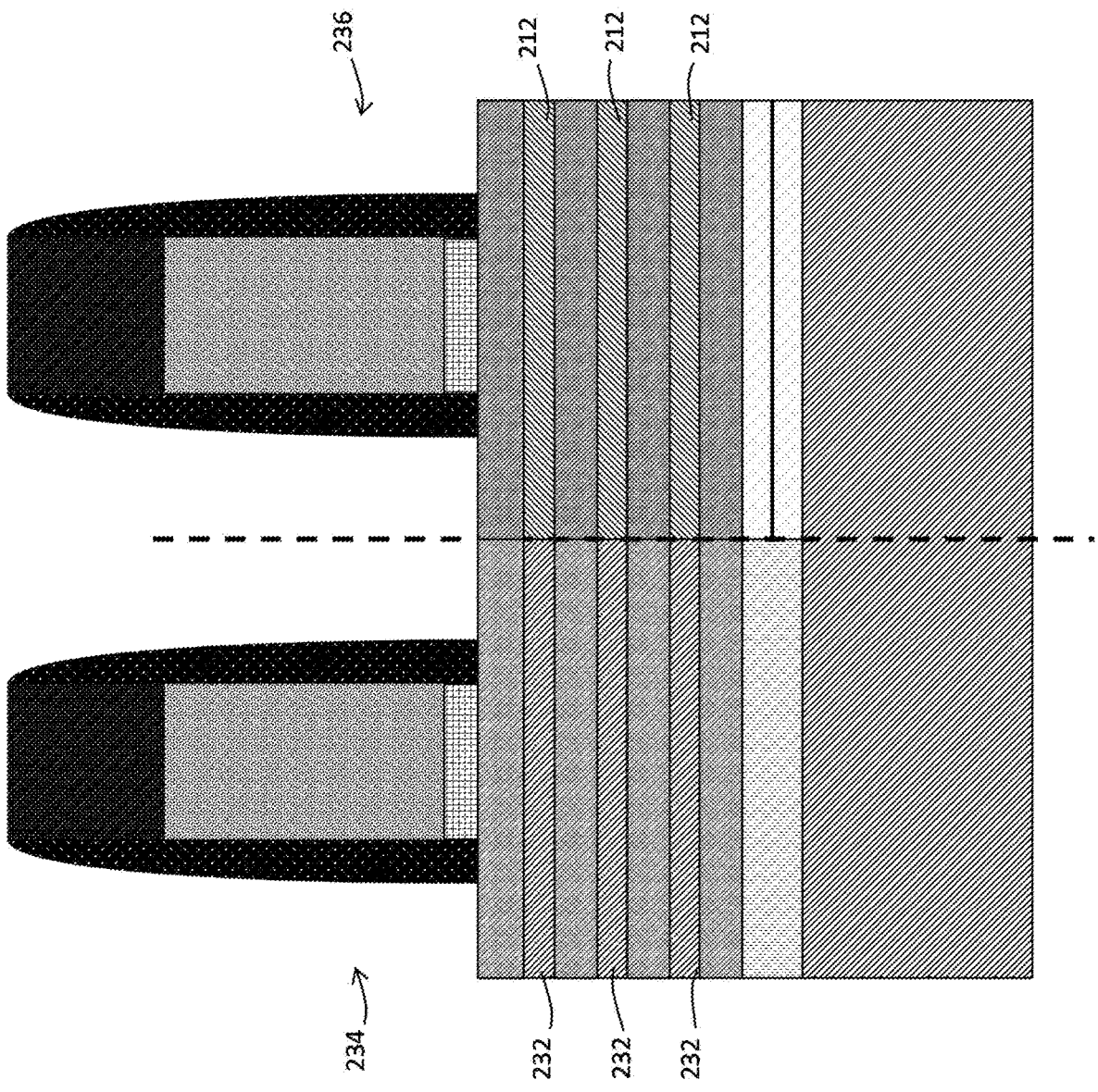
FIG. 2I illustrates a cross-sectional schematic view of an example of a structure following the performance of a portion of the example method of FIG. 1, in accordance with embodiments of the present disclosure.

FIG. 2I depicts the structure 200 following the performance of this portion of operation 120. As shown, a pFET transistor structure 234 is formed using gate patterning on the portion of the structure above the silicon layers 232 having a (110) crystallographic orientation and an nFET transistor structure 236 is formed using gate patterning on the portion of the structure above the silicon layers 212 having a (100) crystallographic orientation. Also as shown, the high germanium percentage SiGe material 228 is removed and replaced with the BDI layer.

In accordance with at least one embodiment of the present disclosure, the performance of operation 120 further includes the formation of inner spacers between the silicon layers in the silicon—silicon germanium stacks of the structure. The formation of inner spacers in the performance of operation 120 is not within the scope of this disclosure and can be achieved in any suitable manner.

Figure 2J:
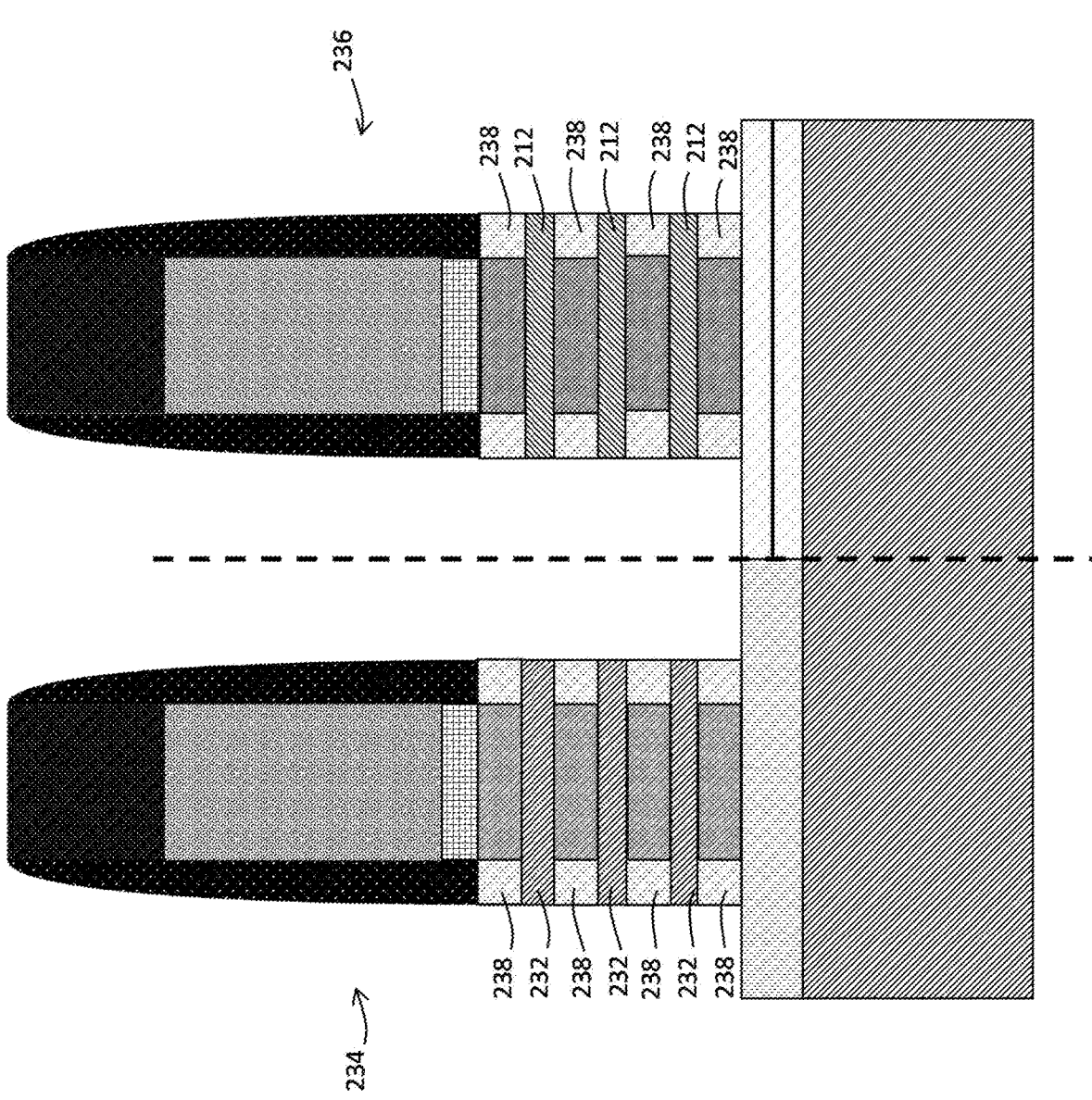
FIG. 2J illustrates a cross-sectional schematic view of an example of a structure following the performance of a portion of the example method of FIG. 1, in accordance with embodiments of the present disclosure.

FIG. 2J depicts the structure 200 following the performance of this portion of operation 120. As shown, inner spacers 238 have been formed between each of the silicon layers 232 arranged beneath the pFET transistor structure 234 and between each of the silicon layers 212 arranged beneath the nFET transistor structure 236.

In accordance with at least one embodiment of the present disclosure, the performance of operation 120 further includes the performance of a channel release and a formation of back end of line (BEOL) and middle of line (MOL) structures. The performance of a channel release and the formation of BEOL and MOL structures in the performance of operation 120 is not within the scope of this disclosure and can be achieved in any suitable manner.

Figure 2K:
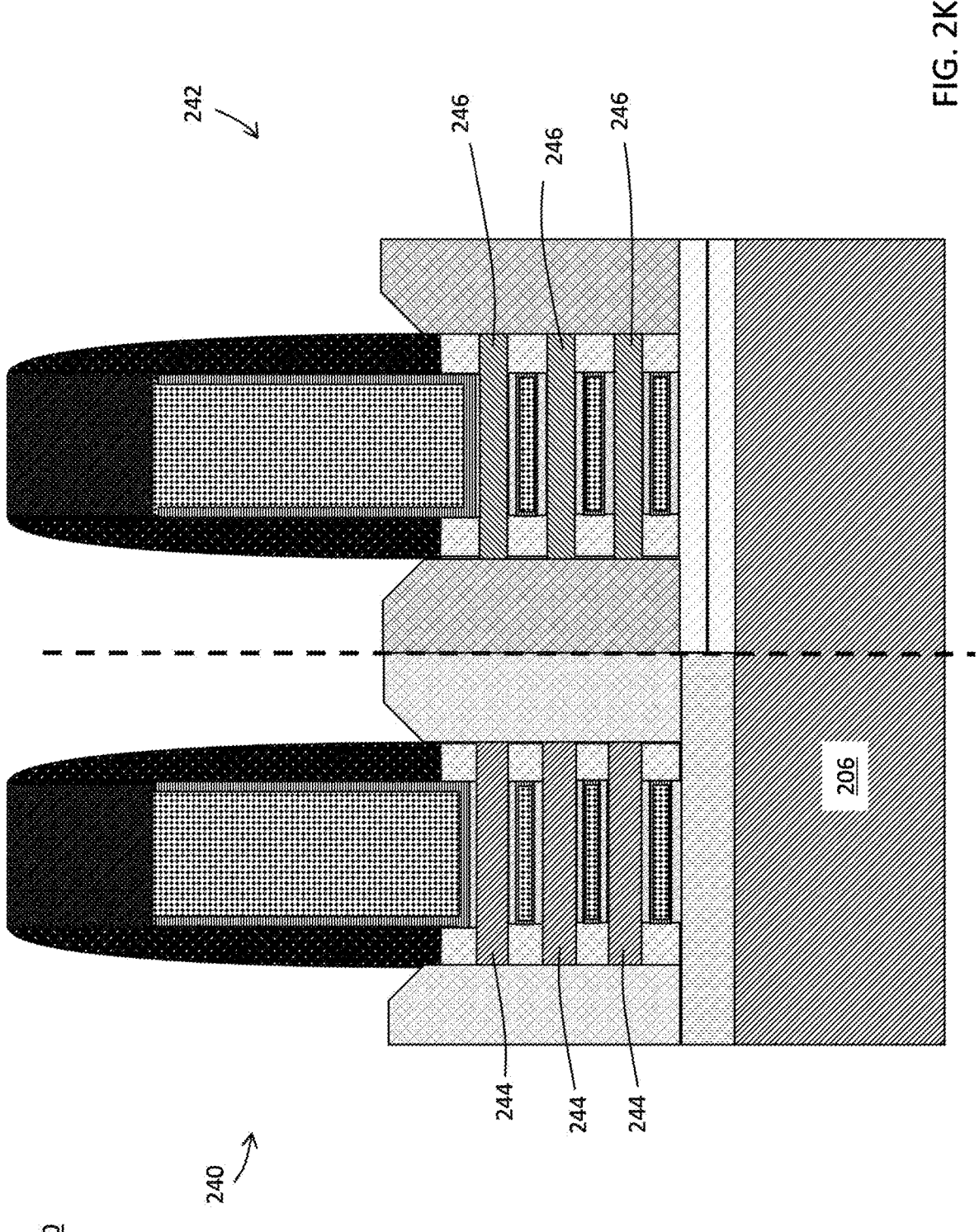
FIG. 2K illustrates a cross-sectional schematic view of an example of a structure following the performance of a portion of the example method of FIG. 1, in accordance with embodiments of the present disclosure.

FIG. 2K depicts the structure 200 following the performance of this portion of operation 120. FIG. 2K depicts the final structure 200 for full CMOS integration. As shown, the final structure includes a pFET 240 and an nFET 242 having channels with different crystallographic orientations. Upon integration into the final structure 200, the silicon layers 232, 212 (shown in FIG. 2J) become the channels 244, 246, respectively. Accordingly, the pFET 240 has channels 244 having a (110) crystallographic orientation and the nFET 242 has channels 246 having a (100) crystallographic orientation. The pFET and nFET share the same silicon substrate 206, which has the same crystallographic orientation as the channels of either the pFET or the nFET. In the embodiment shown, the silicon substrate 206 has the same crystallographic orientation as the channels 244 of the pFET 240. However, as described in further detail below, it is also conversely possible for the silicon substrate 206 to have the same crystallographic orientation as the channels 246 of the nFET 242. Notably, the pFET and nFET are formed on the same horizontal level and share the same gate in logic regions.

As described in further detail below, in accordance with at least one embodiment of the present disclosure, the performance of method 100 can be carried out using bulk to bulk bonding such that an oxide layer is not required in the performance of operation 104 of the method 100.

Figure 3A:
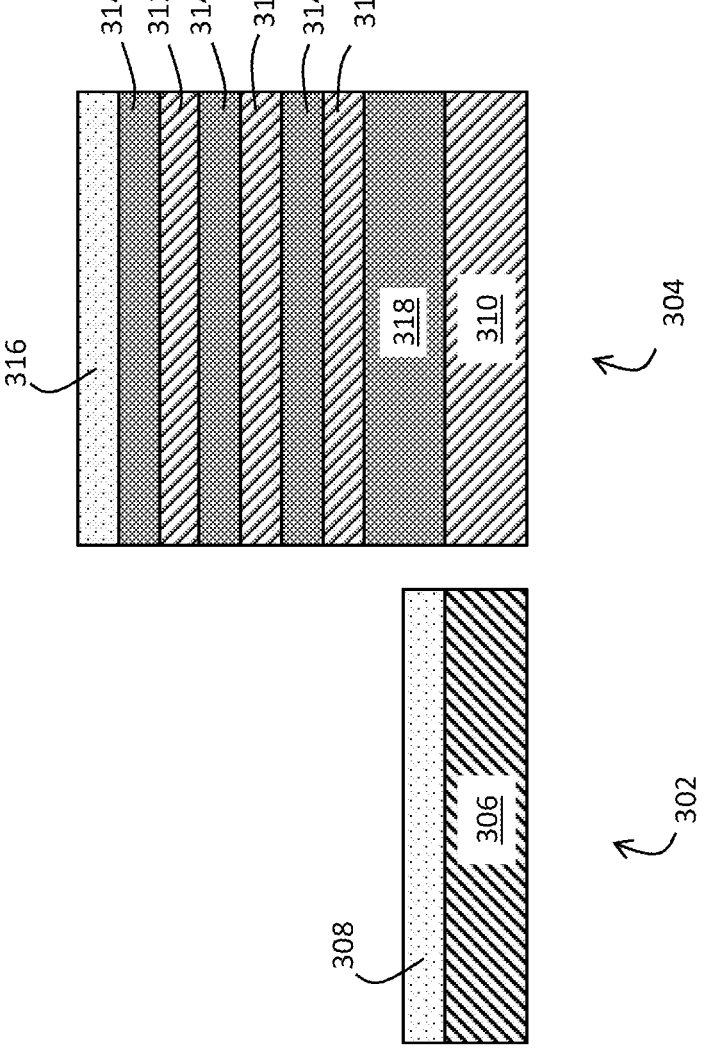
FIG. 3A illustrates a cross-sectional schematic view of an example of a structure following the performance of a portion of the example method of FIG. 1, in accordance with embodiments of the present disclosure.

FIG. 3A depicts an illustrative structure 300 to be used in such embodiments. The structure 300 is similar to the structure 200 described above with respect to FIG. 2A. However, the structure 300 does not include an oxide layer or layer of oxide. Instead, the first wafer 302 includes only a bonding layer 308 on the top side of the silicon substrate 306 and the second wafer 304 includes layers only on the top side of the silicon substrate 310. In particular, the second wafer 304 includes a sacrificial silicon germanium layer 318 on the top side of the silicon substrate 310, alternating silicon layers 312 and silicon germanium layers 314 above the sacrificial silicon germanium layer 318, and a bonding layer 316 above the alternating silicon layers 312 and silicon germanium layers 314. In such embodiments, the silicon substrate 306 of the first wafer 302 has a (100) crystallographic orientation, and the silicon substrate 310 of the second wafer 304 has a (110) crystallographic orientation. In such embodiments, the bonding layers 308, 316 can be made of, for example, SiO2 or SiN.

Figure 3B:
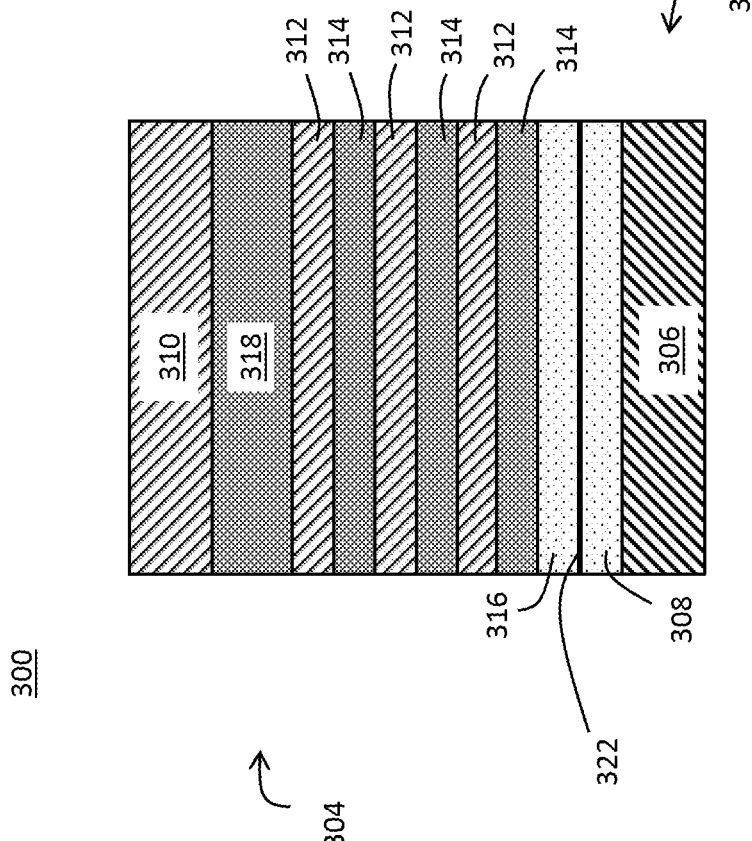
FIG. 3B illustrates a cross-sectional schematic view of an example of a structure following the performance of a portion of the example method of FIG. 1, in accordance with embodiments of the present disclosure.

FIG. 3B depicts the illustrative structure 300 following the performance of operation 104 of the method 100 in which the first wafer 302 is bonded to the second wafer 304. Accordingly, the bonding layers 308 and 316 have been bonded at a bonding interface 322.

Figure 3C:
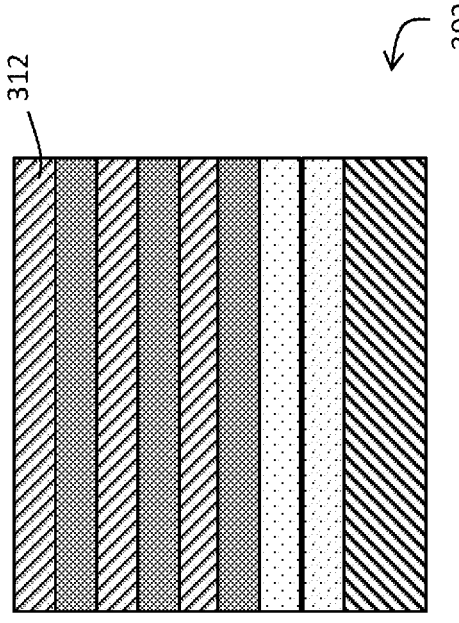
FIG. 3C illustrates a cross-sectional schematic view of an example of a structure following the performance of a portion of the example method of FIG. 1, in accordance with embodiments of the present disclosure.
Figure 3C:

FIG. 3C depicts the illustrative structure 300 following the performance of operation 108 of the method 100 in which the donor substrate 310 is removed from the second wafer 304. More specifically, in this embodiment, the donor substrate 310 and the sacrificial layer 318 (shown in FIG. 3B) are removed from the second wafer 304. Accordingly, in such embodiments, removal can be performed by an etch in which the SiGe of the sacrificial layer is used as an etch stop such that the top-most silicon layer 312 is not impacted by the removal of the donor substrate and sacrificial layer.

Figure 3D:
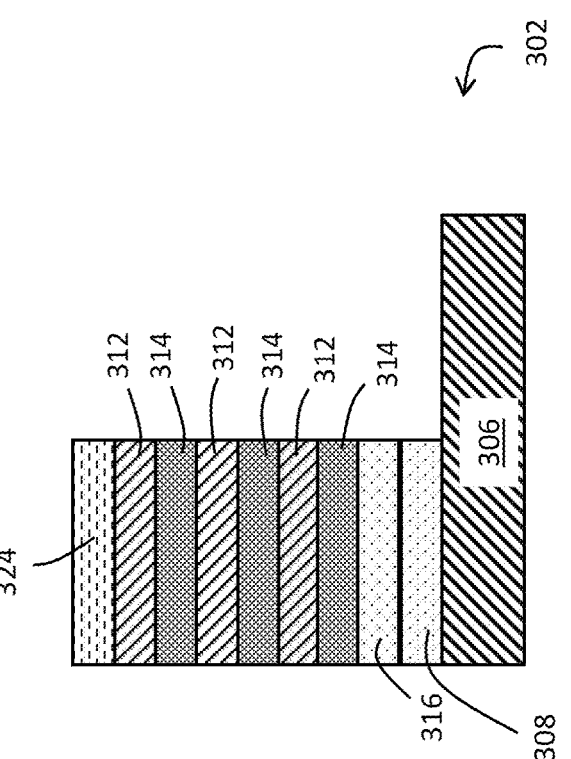
FIG. 3D illustrates a cross-sectional schematic view of an example of a structure following the performance of a portion of the example method of FIG. 1, in accordance with embodiments of the present disclosure.

FIG. 3D depicts the illustrative structure 300 following the performance of operation 112 of the method 100 in which the first portion of the bonded structure is removed. More specifically, in this embodiment, the portions of the silicon germanium layers 314 and silicon layers 312 that are not covered by the mask 324 are removed, and the portions of the bonding layers 308 and 316 that are not covered by the mask 324 are removed. Accordingly, the portion of the uppermost surface of the silicon substrate 306 of the first wafer 302 that is not covered by the mask 324 is exposed.

Figure 3E:
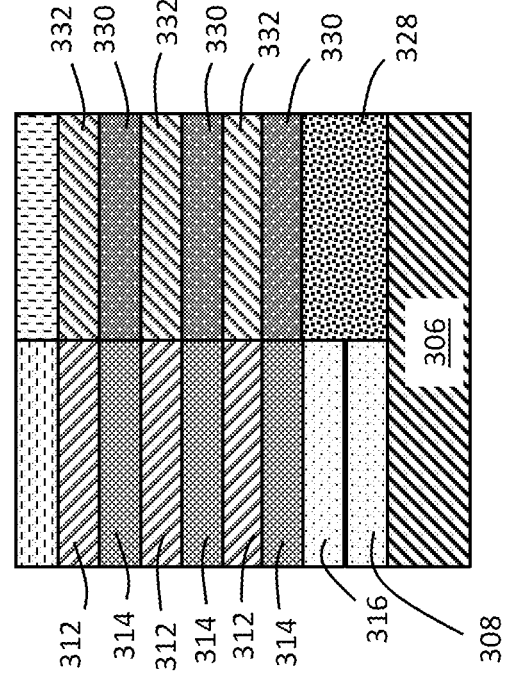
FIG. 3E illustrates a cross-sectional schematic view of an example of a structure following the performance of a portion of the example method of FIG. 1, in accordance with embodiments of the present disclosure.

FIG. 3E depicts the illustrative structure 300 following the performance of operation 116 of the method 100 in which a replacement portion is formed. Accordingly, the structure 300 includes a bottom seeding layer 328 that is substantially the same thickness as the bonding layers 308, 316. The bottom seeding layer 328 can be made of, for example, a SiGe having a high percentage of germanium. The structure 300 also includes alternating silicon layers 332 and silicon germanium layers 330 formed above the bottom seeding layer 328.

The performance of operation 120 of the method 100 may proceed from the structure 300 shown in FIG. 3E in substantially the same manner as from the structure 200 shown in FIG. 2H.

Notably, because the silicon substrate 306 on which the bottom seeding layer 328, silicon layers 332, and silicon germanium layers 330 were formed has a (100) crystallographic orientation, each of the silicon layers 332 has a (100) crystallographic orientation. Accordingly, one way that the structure 300 described with reference to FIGS. 3A-3E differs from the structure 200 described with reference to FIGS. 2A-2K is that the epitaxially grown silicon layers 332 in the replacement portion have a (100) crystallographic orientation. In contrast, the epitaxially grown silicon layers 232 in the replacement portion of the structure 200 have a (110) crystallographic orientation. Accordingly, these embodiments illustrate that the method 100 can be used to form silicon layers/channels having a (100) crystallographic orientation or a (110) crystallographic orientation. Therefore, the method 100 can be used to form a pFET having channels of the same crystallographic orientation as the base substrate or to form an nFET having channels of the same crystallographic orientation as the base substrate.

As described in further detail below, in accordance with at least one embodiment of the present disclosure, the performance of method 100 can be carried out by forming a structure directly on bulk such that bonding layers are not required in the performance of operation 104 of the method 100.

Figure 4A:
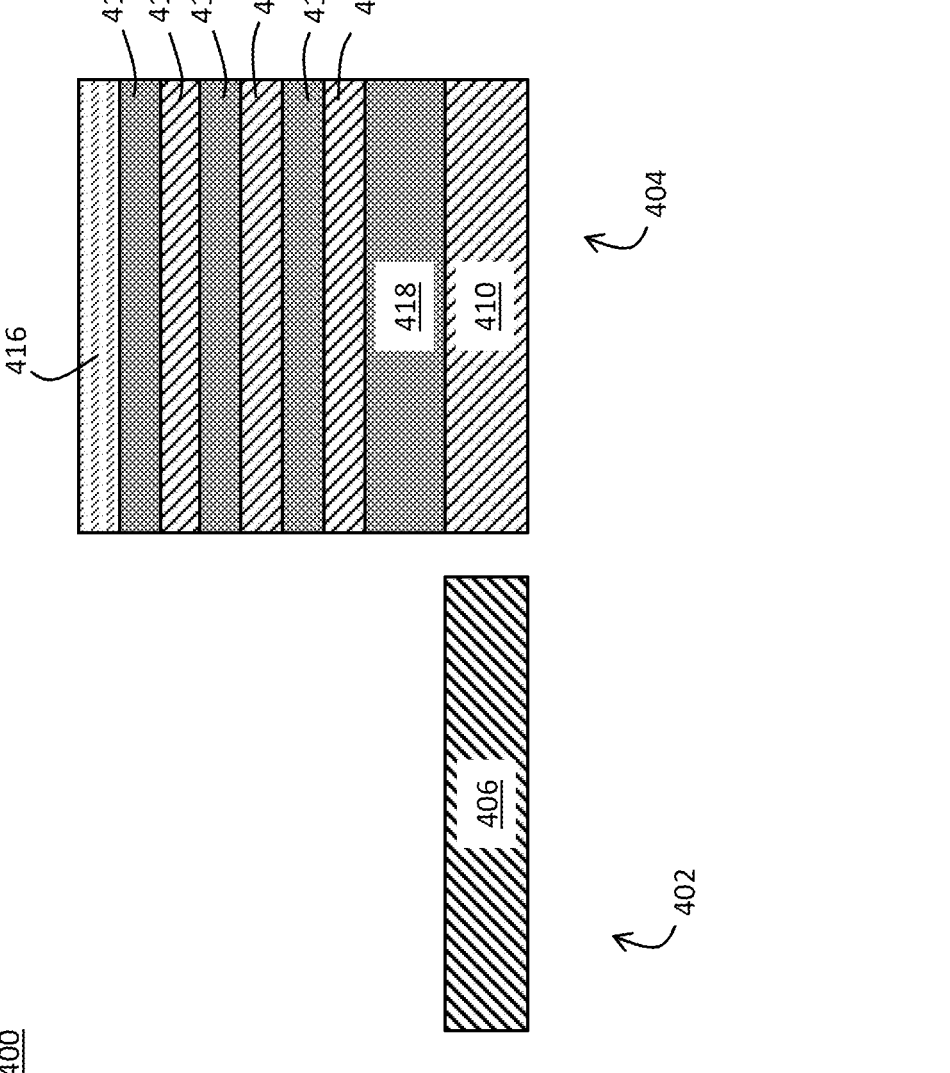
FIG. 4A illustrates a cross-sectional schematic view of an example of a structure following the performance of a portion of the example method of FIG. 1, in accordance with embodiments of the present disclosure.

FIG. 4A depicts an illustrative structure 400 to be used in such embodiments. The structure 400 is similar to the structure 300 described above with respect to FIG. 3A. However, the structure 400 does not include any layers besides the silicon substrate on the first wafer. Instead, the first wafer 402 includes only the silicon substrate 406. Like the second wafer 304, the second wafer 404 includes layers only on the top side of the silicon substrate 410. In particular, the second wafer 404 includes a sacrificial layer 418 on the top side of the silicon substrate 410, alternating silicon layers 412 and silicon germanium layers 414 above the sacrificial layer 418, and a bonding layer 416 above the alternating silicon layers 412 and silicon germanium layers 414. In such embodiments, the silicon substrate 406 of the first wafer 402 has a (100) crystallographic orientation, and the silicon substrate 410 of the second wafer 404 has a (110) crystallographic orientation. In such embodiments, the bonding layer 416 can be made of, for example, a SiGe having a high percentage of germanium, and the sacrificial layer 418 and silicon germanium layers 414 can be made of, for example, SiGe.

Figure 4B:
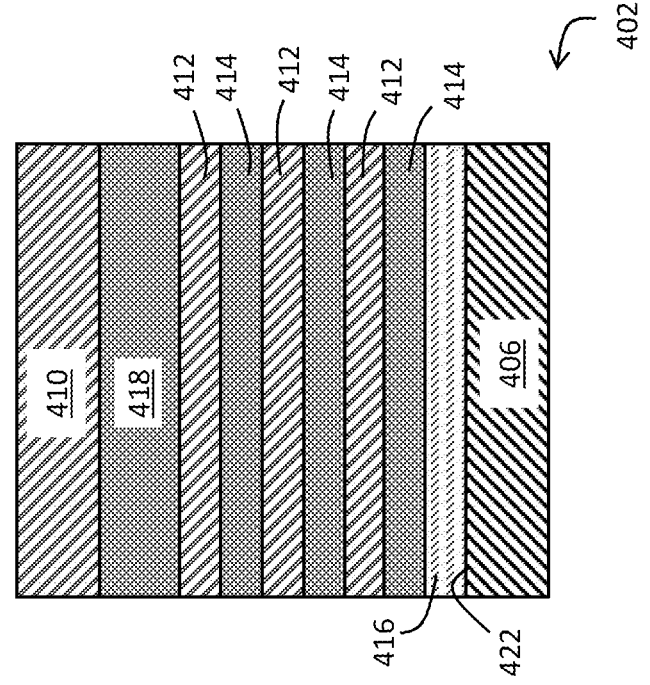
FIG. 4B illustrates a cross-sectional schematic view of an example of a structure following the performance of a portion of the example method of FIG. 1, in accordance with embodiments of the present disclosure.

FIG. 4B depicts the illustrative structure 400 following the performance of operation 104 of the method 100 in which the first wafer 402 is bonded to the second wafer 404. In this embodiment, the bonding layer 416 is bonded directly to the uppermost surface of the silicon substrate 406 of the first wafer 402. Accordingly, the bonding interface 422 is formed at the uppermost surface of the silicon substrate 406 of the first wafer 402.

Figure 4C:
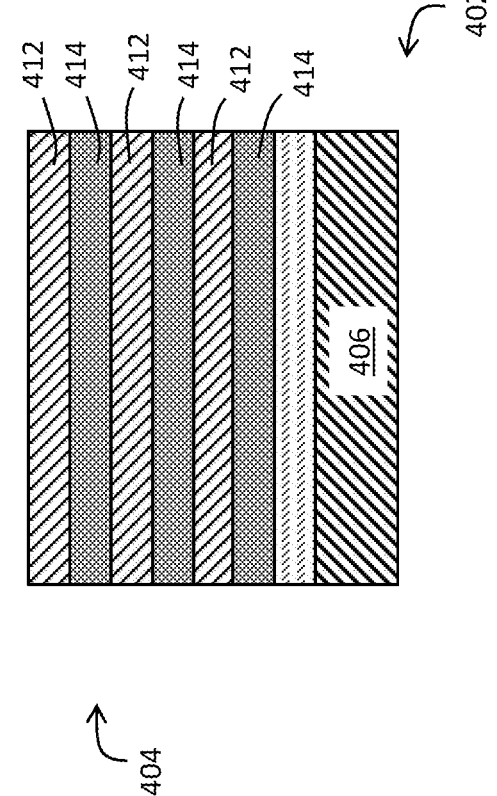
FIG. 4C illustrates a cross-sectional schematic view of an example of a structure following the performance of a portion of the example method of FIG. 1, in accordance with embodiments of the present disclosure.

FIG. 4C depicts the illustrative structure 400 following the performance of operation 108 of the method 100, in which the donor substrate 410 is removed from the second wafer 404. As in the previous embodiment, the donor substrate 410 and the sacrificial layer 418 (shown in FIG. 4B) are removed from the second wafer 404 using an etch that will remove the SiGe of the sacrificial layer without impacting the top-most silicon layer 412.

Figure 4D:
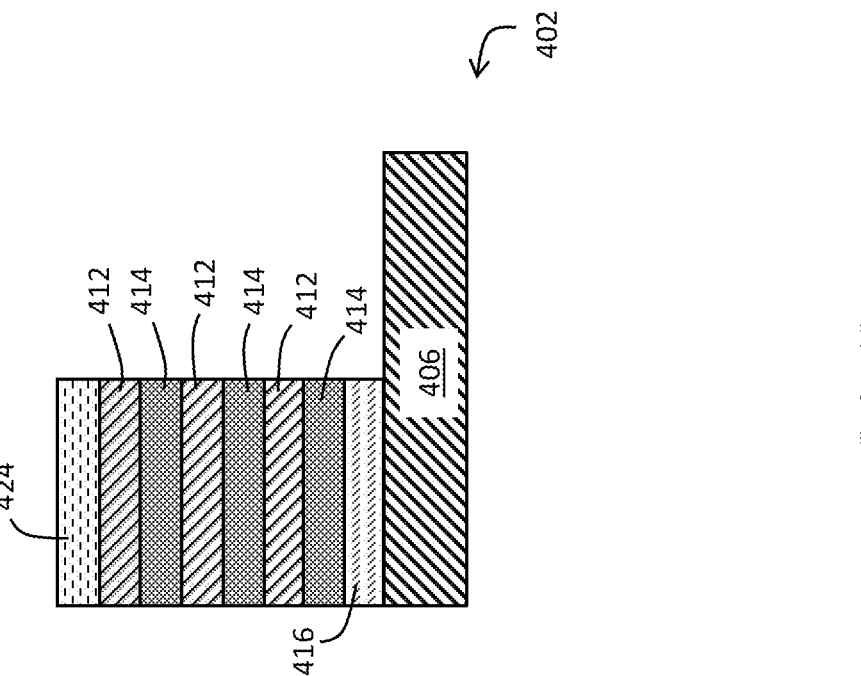
FIG. 4D illustrates a cross-sectional schematic view of an example of a structure following the performance of a portion of the example method of FIG. 1, in accordance with embodiments of the present disclosure.

FIG. 4D depicts the illustrative structure 400 following the performance of operation 112 of the method 100 in which the first portion of the bonded structure is removed. As in the previous embodiment, the portions of the silicon germanium layers 414 and silicon layers 412 that are not covered by the mask 424 are removed, and the portion of the bonding layer 416 that is not covered by the mask 424 is removed. Accordingly, the portion of the uppermost surface of the silicon substrate 406 of the first wafer 402 that is not covered by the mask 424 is exposed.

Figure 4E:
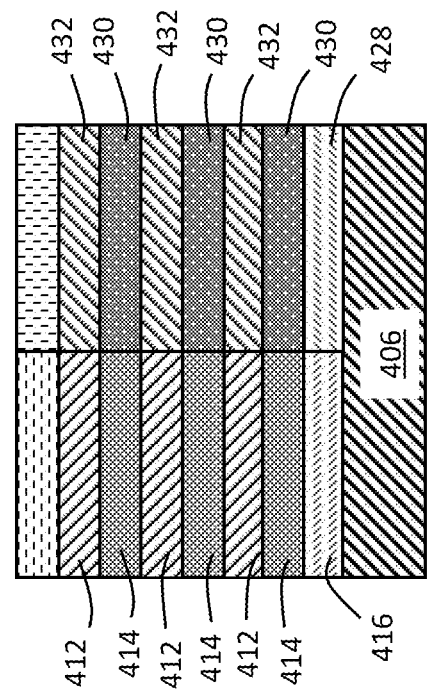
FIG. 4E illustrates a cross-sectional schematic view of an example of a structure following the performance of a portion of the example method of FIG. 1, in accordance with embodiments of the present disclosure.

FIG. 4E depicts the illustrative structure 400 following the performance of operation 116 of the method 100 in which a replacement portion is formed. Accordingly, the structure 400 includes a bottom seeding layer 428 that is substantially the same thickness as the bonding layer 416. The bottom seeding layer 428 can be made of, for example, a SiGe having a high percentage of germanium. The structure 400 also includes alternating silicon layers 432 and silicon germanium layers 430 formed above the bottom seeding layer 428.

In alternative embodiments, the structure 400 can include a bottom silicon layer in place of the bottom SiGe layer 428. In such embodiments, the bottom silicon layer is grown epitaxially on the silicon substrate so as to have a thickness that is substantially the same as that of the bonding layer 416. Additionally, the bottom silicon layer will have a crystallographic orientation that is the same as that of the silicon substrate on which it is grown. In such embodiments, the pFET and the nFET of the final structure will have substantially different underlying layer structures. More specifically, one will have one or more bonding layers present while the other will have only silicon.

As in the previous embodiment, because the silicon substrate 406 on which the bottom SiGe layer 428, silicon layers 432, and silicon germanium layers 430 were formed has a (100) crystallographic orientation, each of the silicon layers 432 has a (100) crystallographic orientation.

The performance of operation 120 of the method 100 may proceed from the structure 400 shown in FIG. 4E in substantially the same manner as from the structure 200 shown in FIG. 2H.

Notably, any of the above bonding techniques can be used in combination with a first wafer having a silicon substrate with either a (100) or a (110) crystallographic orientation. Accordingly, it is possible to achieve various resulting architectures using the method 100. All resulting architectures include the hybrid orientation of channels of the nFET and the pFET of the final device.

As another alternative, the method 100 can be used to form a semiconductor device in which pFETs and nFETs in logic regions of the device are formed having different crystallographic orientations and pFETs and nFETs in static random access memory (SRAM) regions of the device are formed having the same crystallographic orientation. In such embodiments, the removal of the first portion of the bonded structure and the formation of the replacement structure are not necessary in SRAM regions of the device.

In addition to embodiments described above, other embodiments having fewer operational steps, more operational steps, or different operational steps are contemplated. In some embodiments, operational steps may include the performance of different sub-operations and/or the sub-operations may be performed during the performance of different operational steps. Also, some embodiments may perform some or all of the above operational steps or sub-operations in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. However, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A semiconductor device, comprising:
a shared semiconductor substrate having a (110) crystallographic orientation;
a gate all around (GAA) p-type field-effect transistor including first channels made of silicon having a (110) crystallographic orientation;
a GAA n-type field-effect transistor including second channels made of silicon having a (100) crystallographic orientation;
a first gate surrounding the first channels;
a second gate surrounding the second channels;
a silicon oxide layer comprising a first bonding oxide layer directly connected to the shared semiconductor substrate and a second bonding oxide layer directly connected to a bottom surface of the second gate, wherein the first bonding oxide layer is directly connected to the second bonding oxide layer and wherein a bonding interface exists between the first bonding oxide layer and the second bonding oxide layer; and
a bottom dielectric isolation (BDI) layer directly connected to a bottom surface of the first gate and directly connected to the shared semiconductor substrate, wherein the BDI layer is composed of a different dielectric material than the silicon oxide layer.

2. The semiconductor device of claim 1, wherein:
each of the first channels is a first silicon sheet;
each of the second channels is a second silicon sheet; and
the GAA p-type field-effect transistor includes a number of first silicon sheets that is equal to a number of second silicon sheets included in the GAA n-type field-effect transistor.

3. The semiconductor device of claim 2, wherein:
a thickness of each of the first silicon sheets is substantially equal to a thickness of each of the second silicon sheets.

4. The semiconductor device of claim 2, wherein:
each of the first silicon sheets is included in a p-type stack;
each of the second silicon sheets is included in an n-type stack; and an uppermost surface of the p-type stack is substantially coplanar with an uppermost surface of the n-type stack.

5. A semiconductor device, comprising:

a shared semiconductor substrate having a (100) crystallographic orientation;

a first gate all around (GAA) transistor over the shared semiconductor substrate, the first GAA transistor comprising first channels having a (100) crystallographic orientation;

a second GAA transistor over the shared semiconductor substrate, the second GAA transistor including second channels having a (110) crystallographic orientation;

a first gate surrounding the first channels;

a second gate surrounding the second channels;

a silicon oxide layer comprising a first bonding oxide layer directly connected to the shared semiconductor substrate and a second bonding oxide layer directly connected to a bottom surface of the second gate, wherein the first bonding oxide layer is directly connected to the second bonding oxide layer and wherein a bonding interface exists between the first bonding oxide layer and the second bonding oxide layer; and a bottom dielectric isolation (BDI) layer directly connected to a bottom surface of the second gate and directly connected to the shared semiconductor substrate, wherein the BDI layer is composed of a different dielectric material than the silicon oxide layer.

6. The semiconductor device of claim 5, wherein a number of first channels is equal to a number of second channels.

7. The semiconductor device of claim 6, wherein a thickness of each of the first channels is substantially equal to a thickness of each of the second channels.

8. The semiconductor device of claim 6, wherein an uppermost surface of a topmost first channel of the first channels is substantially coplanar with an uppermost surface of a topmost second channel of the second channels.

9. The semiconductor device of claim 1, wherein a top surface of the silicon oxide layer is substantially coplanar with a top surface of the BDI layer.

10. The semiconductor device of claim 1, wherein a bottom surface of the silicon oxide layer is substantially coplanar with a bottom surface of the BDI layer.

11. The semiconductor device of claim 5, wherein a top surface of the silicon oxide layer is substantially coplanar with a top surface of the BDI layer.

12. The semiconductor device of claim 5, wherein a bottom surface of the silicon oxide layer is substantially coplanar with a bottom surface of the BDI layer.

\* \* \* \* \*